(12) United States Patent
Drew et al.

(10) Patent No.: US 10,039,197 B2
(45) Date of Patent: Jul. 31, 2018

(54) HOUSING HAVING AN OPENING AND A COVERING DEVICE

(71) Applicant: CONTINENTAL AUTOMOTIVE GMBH, Hannover (DE)

(72) Inventors: Gregory Drew, Zeitlarn (DE); Bernd Roller, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 15/500,724

(22) PCT Filed: Jun. 24, 2015

(86) PCT No.: PCT/EP2015/064185
§ 371 (c)(1),
(2) Date: Jan. 31, 2017

(87) PCT Pub. No.: WO2016/015924
PCT Pub. Date: Feb. 4, 2016

(65) Prior Publication Data
US 2017/0223845 A1    Aug. 3, 2017

(30) Foreign Application Priority Data
Jul. 31, 2014 (DE) ........................ 10 2014 215 047

(51) Int. Cl.
*H05K 5/00* (2006.01)
*H05K 5/02* (2006.01)
(Continued)

(52) U.S. Cl.
CPC ......... *H05K 5/0017* (2013.01); *H05K 5/0217* (2013.01); *H05K 5/03* (2013.01); *H05K 5/06* (2013.01)

(58) Field of Classification Search
CPC ...... H05K 5/0217; H05K 5/03; H05K 5/0239; H05K 5/0247
See application file for complete search history.

(56) References Cited

U.S. PATENT DOCUMENTS 4,066,837 A * 1/1978 Miura ................. H05K 9/0073
174/366
4,893,215 A * 1/1990 Urushiwara ......... H05K 5/0052
174/535
(Continued)

FOREIGN PATENT DOCUMENTS

DE    8909674 U1    12/1989
DE    3879066 T2    9/1993
(Continued)

*Primary Examiner* — Timothy Thompson
*Assistant Examiner* — Amol Patel
(74) *Attorney, Agent, or Firm* — Laurence A. Greenberg; Werner H. Stemer; Ralph E. Locher

(57) ABSTRACT

A housing includes a main housing part with an opening as well as a covering device for the opening. The covering device has a first cover part, which at least substantially covers the opening and a second cover part which is separate from the first cover part, bears at least in certain regions against the first cover part and has at least one clearance or aperture in the region of the opening. The second cover part is fastened or supported at the main housing part, in particular in the region of a periphery of the main housing part that extends or runs around the opening. The weight of the covering device is therefore low and yet a high level of stability and sealing in relation to fluids is provided.

16 Claims, 4 Drawing Sheets

(51) Int. Cl.
 *H05K 5/06* (2006.01)
 *H05K 5/03* (2006.01)

(56) References Cited

U.S. PATENT DOCUMENTS

| | | | | |
|---|---|---|---|---|
| 6,297,448 | B1* | 10/2001 | Hara | H05K 5/0047 |
| | | | | 174/50.5 |
| 7,440,282 | B2 | 10/2008 | Brandenburg et al. | |
| 9,462,732 | B2* | 10/2016 | Robinson | H05K 9/0032 |
| 9,468,119 | B2 | 10/2016 | Beck | |
| 2016/0198581 | A1* | 7/2016 | Caille | H02G 3/123 |
| | | | | 174/50 |

FOREIGN PATENT DOCUMENTS

| | | |
|---|---|---|
| DE | 19505125 A1 | 8/1995 |
| DE | 102011080988 A1 | 2/2013 |
| EP | 0545115 A1 | 6/1993 |

\* cited by examiner

HOUSING HAVING AN OPENING AND A COVERING DEVICE

BACKGROUND OF THE INVENTION

Field of the Invention

The invention lies in the field of electrical engineering and mechanical engineering and deals specifically with housings, for example for electrical control units. Such housings are used for electrical control units in particular where electrical or electronic components need to be protected from environmental influences or from contact with other functional elements or where other parts of the surroundings are intended to be protected from the influence of elements inside the housing.

Versatile housings are necessary, particularly in automotive engineering, in order to accommodate functional elements or electrical assemblies and to protect them from the influence of moisture and liquids, from changes in temperature and dirt. Such housings have to be long lasting, close durably and reliably in the event of extreme changes in temperature and of mechanical loads and be easy to produce. In addition, such housings should be cost-effective and lightweight in order not to increase the overall weight of a vehicle more than necessary.

Such housings for accommodating electrical or electronic assemblies are already widely known. Thus, such a housing is described for example in the German utility model DE 8909674 U1.

A housing for accommodating electrical, electronic and mechanical components, which can be assembled in particular in a modular manner on account of its structure, is also known from the European patent application EP 0545115 A1.

Against the background of the prior art, the present invention is based on the object of creating a particularly lightweight and/or easy to assemble housing which has an opening that is closable in particular in a durable and reliable manner, wherein high demands can be placed on its imperviousness.

SUMMARY OF THE INVENTION

The object is achieved by a housing having a main housing part, which has an opening, and a covering device for the opening with a first cover part which at least substantially covers the opening and with a second cover part which is in particular separate from the first cover part, bears at least regionally on the first cover part and has at least one clearance in the region of the opening. The second cover part is fastened to or supported on the main housing part, in particular in the region of a periphery of the main housing part that extends around the opening. The dependent claims represent advantageous configurations of the housing according to the invention.

A housing is specified. The housing has a main housing part. The main housing part has an opening. The housing also has a covering device for the opening. The covering device has a first cover part and a second cover part. According to a further aspect, an electronic control unit for a motor vehicle is specified, which has the housing and which has in particular an electronic assembly accommodated in the main housing part.

The first cover part at least substantially covers the opening. Preferably, the first cover part covers the opening preferably completely and projects in particular laterally beyond the opening. In this case, in one configuration, the first cover part can have cutouts, for example for passing through electrical lines and/or for a pressure compensation element. In the finished state of an electronic control unit with the housing, the cutouts are expediently closed off in a fluid-tight manner, for example by means of at least one plug connector and/or by means of a pressure compensation element. The overall area of the cutouts is in particular as small as possible, for example less than or equal to 20%, in particular less than or equal to 10% of the area of the opening. In another configuration, the first cover part completely covers the opening. In a preferred further configuration, the first cover part covers the opening in a fluid-tight manner.

The second cover part is separate from the first cover part. In particular, the first cover part and the second cover part are manufactured separately from one another and are preferably nondestructively separable from one another. The second cover part bears at least regionally on the first cover part. In the region of the opening, it has at least one clearance. In other words, a large part of the area of the opening—for example 60% or more, in particular 80% or more—is not covered by the second cover part. The second cover part is fastened to or supported on the main housing part—in particular in the region of an edge of the main housing part and/or in the region of the periphery of the housing opening. Preferably, the second cover part is fastened directly to or supported directly on the main housing part.

Advantageously, the functions of sealing the housing opening—in particular fluid-tight sealing—and mechanically stabilizing the covering device are divided between two cover parts. The first cover part covers the entire housing opening and reaches at least as far as the periphery of the housing opening, where it ends together therewith. The second cover part serves to stabilize the first cover part, is arranged parallel thereto for example in a sandwiched manner and so as to bear at least partially thereon, and is preferably fastened directly to the main housing part, independently of the first cover part. In this way, the entire covering device is stabilized. The first cover part can be fixed to the main housing part independently of the second cover part, but provision can also be made for the first cover part to be fastened to or pressed against the main housing part by means of the second cover part.

The second cover part can be fastened to the main housing part for example by tabs, integrally formed fastening elements, screws, rivets or bent portions of the second cover part. However, other joining techniques, such as welding, soldering or adhesive bonding are also conceivable.

The second cover part can have large clearances in the region of the housing opening, and so a high weight saving is possible in particular in the second cover part. The clearances can be configured at least in part as apertures. In particular, provision can also be made for the second cover part to have one or more continuous clearances of such a size that it substantially represents a frame which supports the first cover part and/or presses against the main housing part exclusively in the region in which the first cover part bears on the peripheries of the housing opening. This can be taken to such an extent that the second cover part has one or more clearances that extend over the entire housing opening. In this case, narrow crosspieces can remain between the clearances, said crosspieces serving to stabilize the frame-like outer regions of the second cover part.

In one advantageous configuration of the invention, the second cover part is arranged on the outer side, facing away from the interior of the housing, of the first cover part. In this case, the second cover part can cover the first cover part on the outside and be placed thereon for example in a frame-like manner. In particular, in this case, a peripheral region, extending around the opening, of the first cover part is arranged between the main housing part and the second cover part and preferably clamped in place thereby.

However, provision can also advantageously be made for the second cover part to be arranged on the inner side, facing the interior of the housing, of the first cover part. In this case, the supporting second cover part extends along the inner side of the first cover part, in the process is advantageously fastened, in the region of the housing opening, to the periphery of the latter, and can be firmly connected for example to the first cover part by a joining technique. In any case, the first and the second cover part can form parallel layers of the covering device.

In a further advantageous configuration of the invention, the second cover part extends, in the region of the periphery of the opening, in a frame-like manner along the inner side or outer side of the first cover part. For example, the clearance in the second cover part can be formed in a rectangular or square manner such that the frame bounding the clearance has the same width all round in all regions. This ensures uniform support of the first cover part in the region in which it bears on the periphery of the housing opening.

In addition, the invention can advantageously be configured in that the second cover part has at least one crosspiece which connects together two different points, in particular located diametrically opposite one another, on the periphery of the covering device. Thus, the second cover part can for example have a region configured in the form of a cross or star, or a generally grid-like region of the second cover part can be formed by one or more clearances in the region of the housing opening. In this case, it may be advantageous for the second cover part to have a frame region that extends around the region in the form of a cross, star or grid, in order to stabilize the crosspieces with respect to one another. Such a frame also ensures in particular additional stability in the peripheral region of the first cover part, in which an encircling seal region is often located, in which the first cover part ends flush with the periphery of the housing opening.

With such a structure of the second cover part, provision can advantageously be made for the crosspieces to extend in a straight line. However, provision can also be made, alternatively or in addition, for crosspieces that extend in a curved manner, for example as concentric rings, to be provided.

The invention can advantageously be configured in that the second cover part consists of the same—in particular metal—material as the first cover part and in particular has the same material thickness as the first cover part. This measure lowers costs since both cover parts are processed identically and can be produced from the same basic material. In addition, materials of the same type are often easier to connect together than materials of different types, and the coefficients of thermal expansion are also the same, such that in the event of changes in temperature, no relative movement of the cover parts with respect to one another occurs.

Clearances can in particular be easily cut or punched out of the second cover part, for example when the cover parts are manufactured from a metal sheet. In this way, the first and the second cover part are particularly easy and thus cost-effective to produce in terms of their geometric shape. The connection of two separate cover parts with clearances in the second cover part is easier and more cost-effective in terms of production than the milling of depressions into a one-piece cover part in order to save material and weight.

In a further advantageous configuration of the invention, in the region of the periphery of the opening, the second cover part covers said periphery in the manner of a frame, projects at least partially beyond the first cover part and extends in a bent and/or folded manner around the first cover part and a part of the main housing part, and is fastened to the main housing part. In this way, the second cover part can be fastened to the main housing part in a particularly easy, reliable and dimensionally stable manner, and thus effectively support the first cover part particularly in the outer region in which it bears on the periphery of the housing opening. The second cover part, which, like the first cover part, can be produced for example from a metal sheet, can optionally be crimped together with the main housing part in this way.

In a further advantageous configuration of the invention, an encircling seal is arranged, at the periphery of the housing opening, between the first cover part and the main housing part. This seal can be in the form of an elastomer seal. In one advantageous configuration, the main housing part and/or the first cover part has a groove in which the elastomer seal extends. For example, the groove is formed in a side wall, encircling the opening, of the main housing part, in particular on the end side of the side wall. The elastomer seal can be introduced as a solid seal—in particular as a sealing cord or sealing ring—or can be poured into the groove as a sealing compound. If no groove is provided, an adhesive layer can also be provided between a sealing surface of the first cover part and a peripheral region, encircling the housing opening, of the main housing part—for example the end face of a side wall encircling the opening. The adhesive layer in particular ensures not only the function of fastening the first cover part but also the seal between the main housing part and the first cover part.

In addition, provision can particularly advantageously be made for the first cover part, which has in particular a planar or flat basic shape, to have an encircling rib in its peripheral region, said rib rising from a main surface of the first cover part. The main surface is in particular that surface of the first cover part that faces the opening and covers the opening. The rib is formed in particular by bending the periphery of the first cover part, for example by bending it in a perpendicular manner. Preferably, it projects into the seal or sealing compound, in particular in the direction of the main housing part. In one configuration, the rib projects into the groove. Such a rib can be pushed for example into the material of the seal in order to achieve a particularly long sealing path. As a result of such an edge—formed by the rib—being pushed into the material of the seal, a high surface pressure and thus a particularly reliable seal is achieved. This is in particular very effective when the second cover part is provided on the outer side of the first cover part and presses the first cover part firmly against the main housing part.

Further advantages and advantageous configurations and developments of the housing can be gathered from the following exemplary embodiments illustrated in conjunction with the figures.

DESCRIPTION OF THE INVENTION

Elements that are the same, of the same type or act in the same way are provided with the same reference signs in the figures. In some figures, individual reference signs may have been omitted in order to improve clarity. The figures and the relative sizes of the elements illustrated in the figures with respect to one another should not be considered true to scale. Rather, individual elements may have been illustrated in a manner exaggerated in size for better representation and/or for better comprehension.

Figure 1:
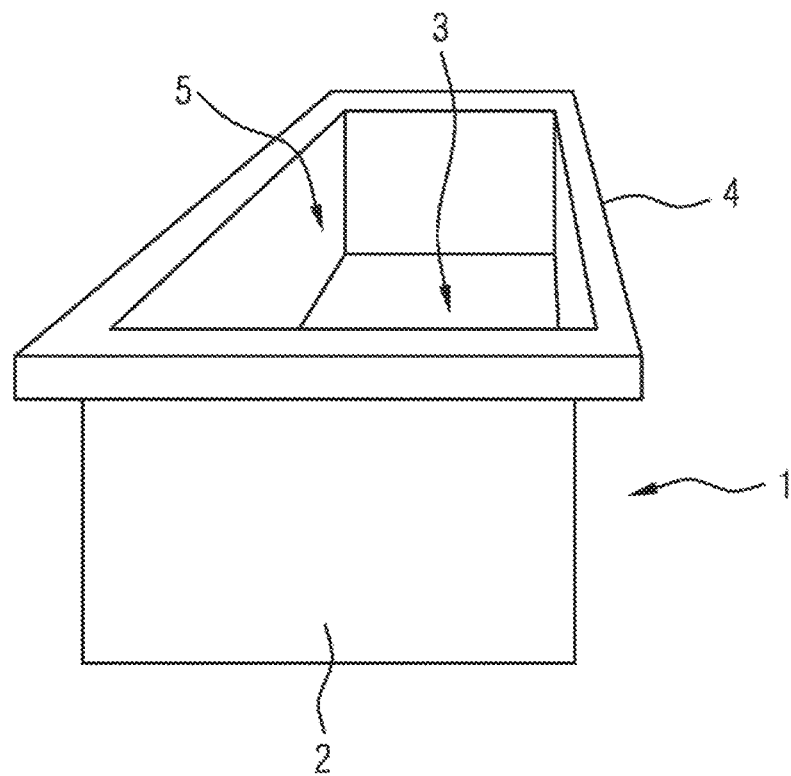
FIG. 1 shows a schematic perspective view of the main housing part of a housing according to a first exemplary embodiment.

FIG. 1 shows a schematic perspective illustration of a main housing part 1 of a housing according to a first exemplary embodiment. The main housing part 1 has four side walls 2 and a base 3. The four side walls 2 together represent an encircling side wall. The main housing part 1 additionally has an encircling periphery 4 which is formed at the end sides of the side walls and extends at the edges thereof that are away from the base 3. In the present exemplary embodiment, the periphery 4 projects laterally beyond the base-side outer contour of the side walls 2 and surrounds a housing opening 5 of the main housing part 1.

The main housing part 1 can consist for example of a plastics material and/or of a metal or an alloy. It may be assembled in a modular manner from individual parts or be produced integrally, for example as an injection-molding. In an expedient configuration of this or some other embodiment, one of the side walls 2 is formed by a housing panel that bears a plug connector (not illustrated in the figures).

Figure 2:
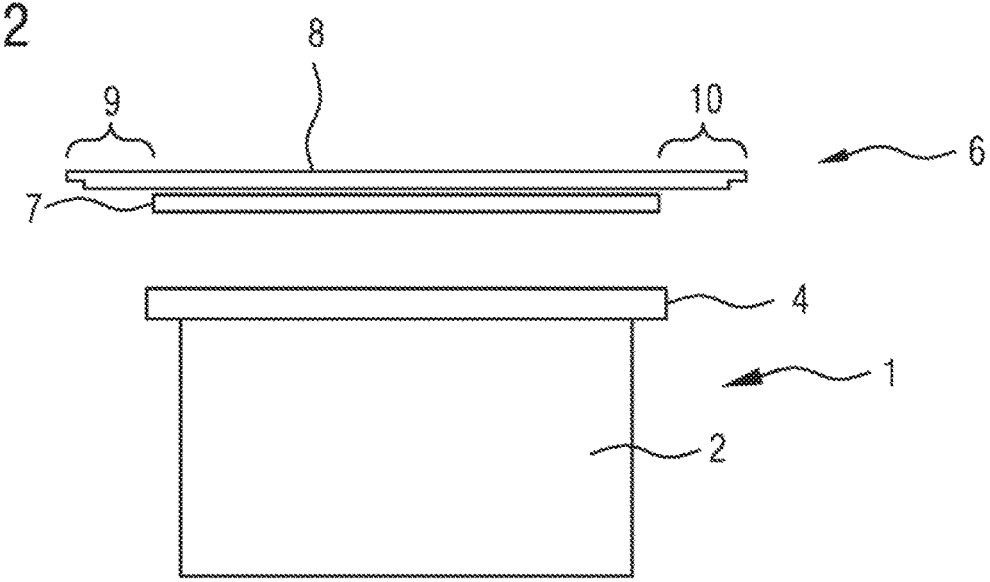
FIG. 2 shows a schematic side view of the main housing part and a covering device, arranged thereabove, of the housing according to the first exemplary embodiment.

FIG. 2 shows a schematic side view of the main housing part 1 with one of the side walls 2 and the periphery 4 thereof and, thereabove, a covering device 6 which for its part has a first cover part 7 and a second cover part 8 located thereabove. If the covering device 6 is placed on the periphery 4 of the housing opening 5 when the housing is assembled, the first cover part 7 rests directly on the periphery 4 and the second cover part 8 rests on the first cover part 7 on that side of the first cover part 7 that faces away from the main housing part 1. The regions 9, 10 of the second cover part 8 that project beyond the first cover part 7 can be bent for example over the periphery 4 of the main housing part 1 or be crimped together therewith in order to fasten the covering device 6 to the main housing part 1.

Figure 3:
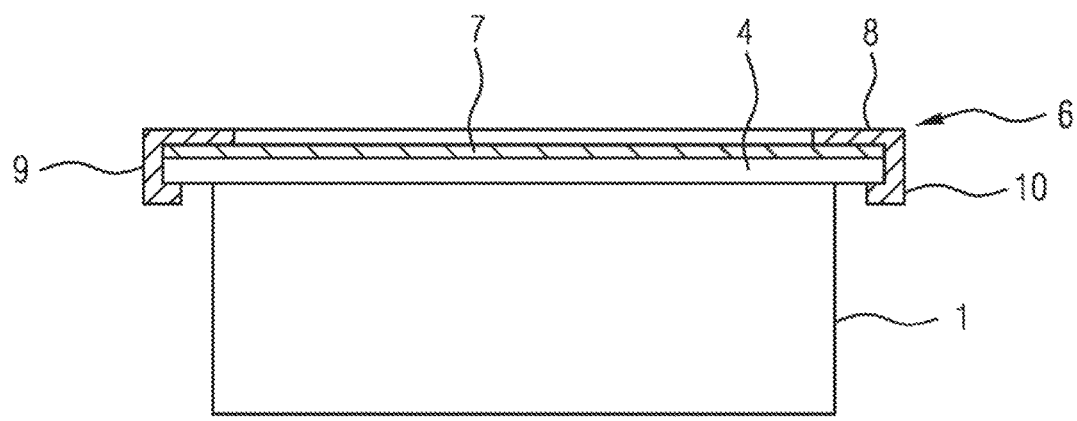
FIG. 3 shows the housing according to the first exemplary embodiment in a partially cutaway schematic side view.

FIG. 3 schematically shows, in partial section, a side view of the main housing part 1 with the crimped-on covering device 6. The regions 9, 10 of the second cover part 8 are bent over and around the periphery 4 and crimped and secure the covering device 6 to the main housing part 1.

Figure 4:
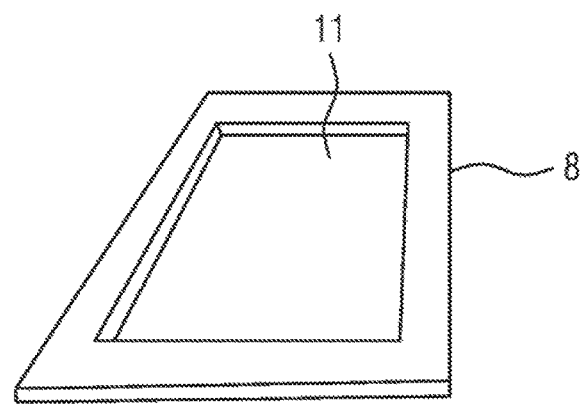
FIG. 4 shows the second cover part of the covering device of the housing of the first exemplary embodiment in a schematic perspective illustration.

FIG. 4 shows a schematic perspective view of the frame-like second cover part 8 of the housing according to the first exemplary embodiment, prior to bending and crimping. The second cover part 8 has a rectangular clearance 11. The second cover part 8 is formed such that it covers the first cover part 7, for example as illustrated in FIG. 3, in the region of the periphery 4, but leaves the remaining regions of the housing opening 5 free. In this way, a large saving in weight of the covering device 6 can be achieved, wherein it is nevertheless ensured that the first cover part 7 reliably bears in a sealing manner in the region of the periphery 4.

Figure 5:
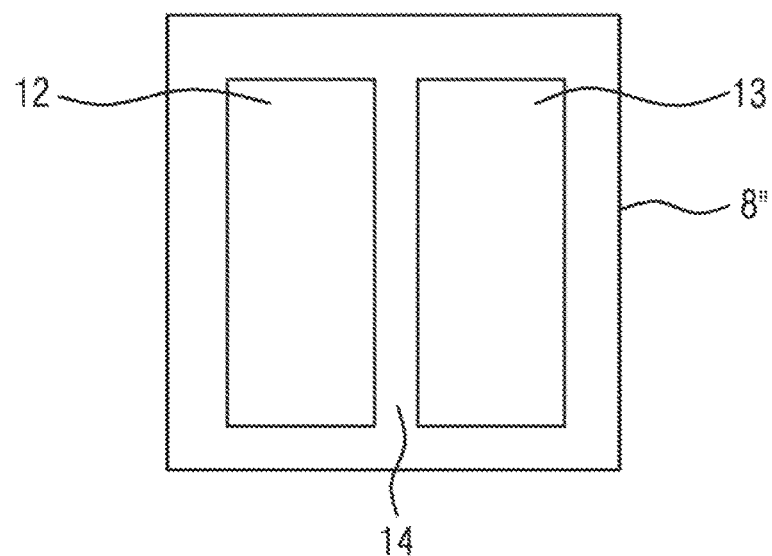
FIG. 5 shows a second exemplary embodiment of a second cover part in a schematic plan view.

FIG. 5 shows a schematic plan view of a second cover part 8" according to a second exemplary embodiment, which has two clearances 12, 13. The crosspiece 14 that remains between the clearances 12, 13 serves to stabilize the second cover part 8", this preventing bending under load.

In addition, by means of the crosspiece 14, stabilization of the central region, overlapping the housing opening 5, of the first cover part 7 can be achieved.

Figure 6:
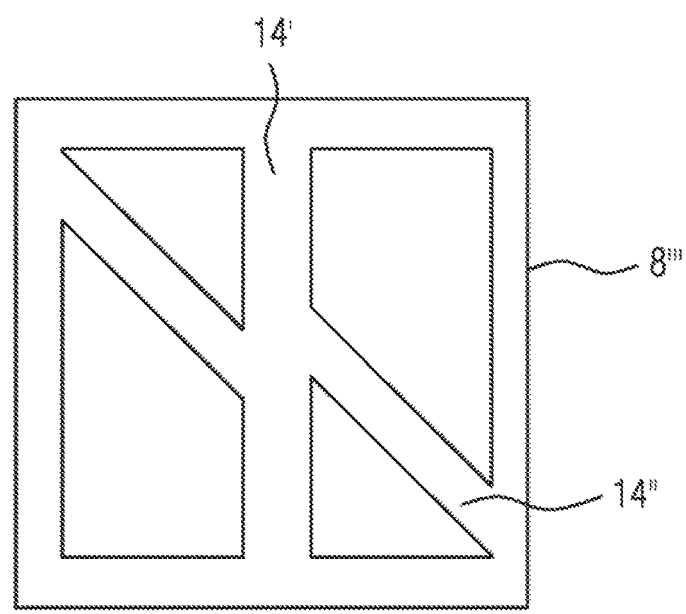
FIG. 6 shows a third exemplary embodiment of a second cover part in a schematic plan view.

FIG. 6 shows a third exemplary embodiment of a second cover part 8''' in a schematic plan view, wherein the two crosspieces 14', 14" are connected together in the center of the clearance. Thus, the central region of the second cover part 8''' is configured in the form of a cross, and in particular it is in the form of a St. Andrew's cross in plan view.

Figure 7:
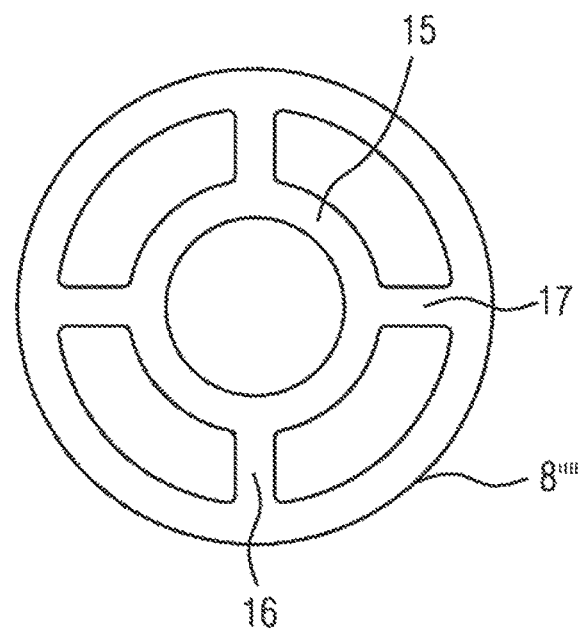
FIG. 7 shows a fourth exemplary embodiment of a second cover part in a schematic plan view.

FIG. 7 shows a fourth exemplary embodiment of a second cover part 8"" in a schematic plan view. This is in particular a component of a covering device 6 for a round housing which also has a round periphery 4. It is advantageous, for such a housing, to also provide a circular first cover part 7 and a likewise second cover part 8"" with a circular outer contour. The second cover part 8"" illustrated in FIG. 7 has a round encircling annular frame which supports the first cover part 7 in the region of the periphery of a round main housing part 1. The second cover part 8"" additionally has an inner ring 15 that is concentric with the outer frame and is connected to the outer frame via individual crosspieces 16, 17 that extend radially.

Figure 8:
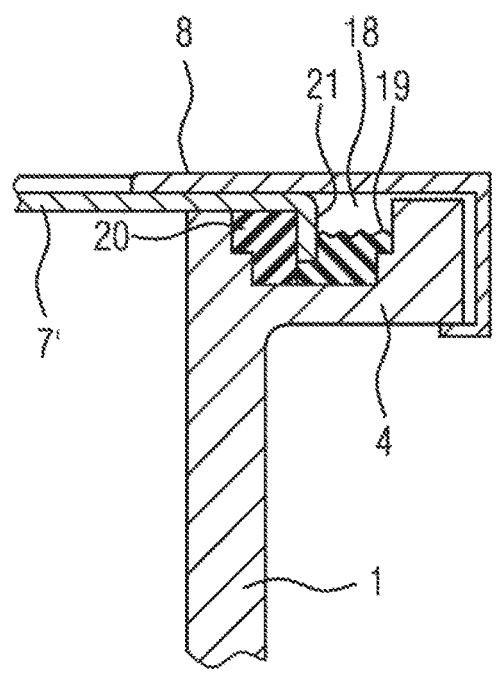
FIG. 8 shows a schematic sectional view of a detail of a housing according to a fifth exemplary embodiment.

FIG. 8 shows a schematic sectional view of a detail of a housing according to a fifth exemplary embodiment. The detail shows a seal 19, 20 on a main housing part 1 onto which a covering device 6 has been placed.

The main housing part 1 corresponds for example substantially to that of the first exemplary embodiment. In contrast thereto, it has a frame 4 which has a groove 18. Such a configuration would also be suitable for the first exemplary embodiment.

The groove 18 extends along the periphery 4 around the housing opening 5 and accommodates a seal 19, 20. The seal 19, 20 can in this case be inserted into the groove 18 as a solid, for example elastomeric part or be poured into the groove 18 as a liquid or viscous compound. A combination of both sealing components can also be provided.

The first cover part 7' has a right-angled bent portion 21 which extends around the circumference of the first cover part 7' and which projects into the groove 18 in the region of the seal 19, 20. The bent portion 21 can be pushed into a solid sealing body with the result that, in combination with the pressure force applied by the second cover part 8, a very high surface pressure arises, which ensures a reliable seal. If the bent portion 21 is pushed into a still partially liquid or viscous sealing compound, the sealing path is extended particularly effectively. The illustrated constellation provides reliable sealing against fluids and thus reliably closes off the interior of the housing of the main housing part.

As a result of the first cover part 7' being covered by means of a second cover part 8 in the region of the periphery 4, mechanical loads on the covering device scarcely have any deforming effect on the first cover part, since the latter is reinforced in particular in the region of the periphery. Nevertheless, this covering device manages with a minimum of mass and weight, since the second cover part 8 has a large clearance in the region of the housing opening.

It is also possible, on a main housing part 1 which has a plurality of openings 5, to provide a plurality of covering devices 6 constructed in accordance with the invention, in particular on mutually opposite sides of the main housing part 1.

The invention claimed is:

1. A housing, comprising:
a main housing part having an opening;
a covering device for said opening, said covering device having a first cover part at least substantially covering said opening and a second cover part bearing at least regionally on said first cover part, said first cover part covering said opening in a fluid-tight manner;
said second cover part having at least one clearance in a vicinity of said opening; and
said second cover part being fastened to or supported on said main housing part;
wherein said opening has a periphery, and said second cover part:
covers said periphery of said opening as a frame,
projects at least partially beyond said first cover part,
extends in at least one of a bent or angled manner around said first cover part and a part of said main housing part and is fastened to said main housing part.

2. The housing according to claim 1, wherein said main housing part has a periphery extending around said opening, and said second cover part is separate from said first cover part and is fastened to or supported on said main housing part in a vicinity of said periphery of said main housing part.

3. The housing according to claim 2, which further comprises a seal extending around said opening between said first cover part and said periphery of said main housing part.

4. The housing according to claim 3, wherein said first cover part has a main surface and a peripheral region, said peripheral region has an encircling rib, and said encircling rib rises from said main surface of said first cover part.

5. The housing according to claim 4, wherein said first cover part has a periphery with an angled portion forming said encircling rib.

6. The housing according to claim 4, which further comprises a seal or sealing compound into which said encircling rib projects, in a direction toward said main housing part.

7. The housing according to claim 6, wherein at least one of said main housing part or said first cover part has a groove in which said seal or sealing compound extends and into which said encircling rib projects.

8. The housing according to claim 1, which further comprises:
an interior of the housing;
said first cover part having an outer side facing away from said interior of the housing; and
said second cover part being disposed on said outer side of said first cover part.

9. The housing according to claim 1, which further comprises:
an interior of the housing;
said first cover part having an inner side facing said interior of the housing; and
said second cover part being disposed on said inner side of said first cover part.

10. The housing according to claim 1, wherein:
said first cover part has an inner side and an outer side;
said opening has a periphery; and
said second cover part extends in a vicinity of said periphery of said opening as a frame on said inner side or said outer side of said first cover part.

11. The housing according to claim 1, wherein said covering device has a periphery, and said second cover part has at least one crosspiece interconnecting two different points on said periphery of said covering device.

12. The housing according to claim 11, wherein said two different points are located diametrically opposite one another.

13. The housing according to claim 11, wherein said at least one crosspiece extends in a straight line.

14. The housing according to claim 1, wherein said first and second cover parts are formed of the same material.

15. The housing according to claim 1, wherein said first and second cover parts have the same material thickness.

16. An electronic control unit for a motor vehicle, comprising a housing according to claim 1.

* * * * *